United States Patent [19]

Azuma et al.

[11] 4,370,180

[45] Jan. 25, 1983

[54] METHOD FOR MANUFACTURING POWER SWITCHING DEVICES

[75] Inventors: Makoto Azuma; Junko Akagi, both of Yokohama, Japan

[73] Assignee: Tokyo Shibaura Denki Kabushiki Kaisha, Japan

[21] Appl. No.: 213,099

[22] Filed: Dec. 4, 1980

Related U.S. Application Data

[63] Continuation-in-part of Ser. No. 193,142, Oct. 2, 1980, abandoned.

[30] Foreign Application Priority Data

Oct. 3, 1979 [JP] Japan .................................. 54-12671
Nov. 30, 1979 [JP] Japan ................................ 54-154305

[51] Int. Cl.³ ........................................ H01L 21/225
[52] U.S. Cl. .................................... 148/187; 148/1.5; 148/189
[58] Field of Search ................ 148/1.5, 33.5, 187, 148/189, 190; 29/571, 576 R; 357/39

[56] References Cited

U.S. PATENT DOCUMENTS

| | | | |
|---|---|---|---|
| 3,445,301 | 5/1969 | Topas et al. | 148/177 |
| 3,809,582 | 5/1974 | Tarneja et al. | 148/1.5 |
| 3,811,975 | 5/1974 | Van Lierop et al. | 29/571 X |
| 3,941,625 | 3/1976 | Kennedy et al. | 148/187 |
| 4,043,837 | 8/1977 | Cresswell et al. | 148/1.5 |
| 4,061,510 | 12/1977 | Kennedy et al. | 148/187 |
| 4,137,099 | 1/1979 | Sun | 148/1.5 |
| 4,156,963 | 6/1979 | Tsuj et al. | 29/581 |

OTHER PUBLICATIONS

Azuma et al., "High Power Gate Turn-Off Thyristors", Jpn. J. of Appl. Physics, vol. 17, (1978), Suppl. 17-1, pp. 275-281.

Azuma et al., "2500 V, 600 A Gate Turn-Off Thyristor (GTO)", International Electron Devices Meeting, Wn., D.C., Dec. 3-5, 1979, pp. 246-249.

Primary Examiner—G. Ozaki
Attorney, Agent, or Firm—Finnegan, Henderson, Farabow, Garrett & Dunner

[57] ABSTRACT

A method for manufacturing power switching devices such as thyristors and power transistors comprising the steps of forming impurity diffused layers of one conductivity type and of the opposite conductivity type in a semiconductor substrate of one conductivity type; forming a film containing phosphorus on the substrate; diffusing lifetime killer atoms into the substrate; and forming electrodes on the substrate.

7 Claims, 27 Drawing Figures

METHOD FOR MANUFACTURING POWER SWITCHING DEVICES

This application is a continuation-in-part of Application Ser. No. 193,142, filed on Oct. 2, 1980, which previous application is now abandoned.

BACKGROUND OF THE INVENTION

This invention relates to an improved method for manufacturing power switching devices, such as gate turnoff thyristors (GTO), SCRs, light activated SCRs and power transistors.

Generally, thyristors have PNPN structures including a P-type anode layer, an N-type base layer, a P-type base layer and a N-type cathode layer.

For such thyristors, it is desired that minority carrier lifetimes in their P-type base layers are sufficiently high and those in their N-type base layers are sufficiently low, to allow anode currents of the thyristors to increase with an increase in the carrier lifetimes in the P-type base layers, and to allow the switching characteristics to improve with a decrease in the carrier lifetimes in the N-type base layers. Thereby, preferable thyristors characteristics are obtained.

A method for manufacturing such a desirable thyristor is disclosed in Japanese Journal of Applied Physics, Vol. 17, Supp. 17-1, pp. 275–281, 1978, "High Power Gate Turn-Off Thyristors." According to this method, a PNP structure is made at first by diffusing P-type impurities into an N-type substrate from both its surfaces. Next, a film containing phosphorus as an N-type impurity is deposited on one side-surface of the diffused PNP wafer. Thereafter, a PNPN structure is formed by a drive-in process.

In the above method, the film containing phosphorus should be essentially removed before the phosphorus drive-in, although this is not shown apparently in the publication.

The reason is that if the film containing phosphorus exists on the wafer surface, the phosphorus content in the N-type cathode layer will be extremely difficult to control during the phosphorus drive-in.

At this step, if too much phosphorus is diffused into the P-type base layer in error, breakdown voltage of the P-base and N-emitter junction decreases due to an increase in the impurity gradient.

According to the above publication, after the step of the phosphorus drive-in, gold is diffused as carrier lifetime killer atoms into the wafer, specifically into the N-type base layer. Through the gold diffusion, minority carrier lifetime of the N-type base decreases. This process contributes to improvement of the switching characteristics of the thyristor.

It is also possible to expect that the phosphorus film formation on the substrate will improve minority carrier lifetime of the P-type base. The reason being that a phosphorus glass has a gettering effect on metal contaminations, such as gold and copper in silicon, as is disclosed in the Journal of the Electrochemical Society, June, 1963, pp. 533–537, "Gettering of Metallic Impurities from Planar Silicon Diodes" and in the Solid-State Electronics Pergamon Press, Vol. 11, pp. 1055–1061, 1968, "The Gettering of Gold and Copper from Silicon."

Especially, in the latter publication, hole lifetime values after phosphorus gettering are shown.

But unexpectedly, according to the actually manufactured thyristors obtained from the above method, carrier lifetimes in the P-type bases are mostly unchanged and low.

As a result, thyristors having high current, high surge current, low on-state voltage and high off-state voltage thus far have not been obtained.

SUMMARY OF THE INVENTION

Accordingly, an object of the invention is to provide a method for manufacturing power switching devices of which minority carrier lifetimes are properly controlled.

Another object of the invention is to provide a method for manufacturing power switching devices having high current and high surge current.

A further object of the invention is to provide a method for manufacturing power switching devices having low on-state voltage and high off-state voltage.

These and other objects have been attained by the method for manufacturing power switching devices which comprises generally the steps of: forming impurity diffused layers of both conductivity types in a semiconductor substrate; thereafter forming a film containing phosphorus on the substrate; and diffusing atoms into the substrate in order to control carrier time.

DETAILED DESCRIPTION OF PREFERRED EMBODIMENTS

The inventors have studied the reasons why carrier lifetimes in P-type base layers of thyristors or power transistors according to a conventional method are still low in spite of the use of film formation including P-type or N-type impurities having a gettering effect, such as phosphorus, boron, and gallium.

As a result, it has been concluded that part of the heavy metallic impurities is caught into the gettering film, but most is collected only into the surface region of the semiconductor substrate while the gettering film is deposited on the P-type base layer.

Accordingly, while the P-type or N-type impurities are driven into the semiconductor substrate under a high temperature condition after the removal of the gettering film, the heavy metallic impurities collected in the surface region of the substrate are diffused again into the P-type base layer. Thus, carrier lifetime in the P-type base layer can not essentially increase.

According to the invention, a film including phosphorus is newly formed after the drive-in of the P-type and N-type impurities into the semiconductor substrate and before the diffusion of lifetime killer atoms. By introducing this new process, the heavy metallic impurities, which have been diffused at the drive-in step under a high temperature, are caught or collected in the surface region of the semiconductor substrate once again. In this way, the invention can provide power switching devices which have high current, high surge current, low on-state voltage and high off-state voltage.

EXAMPLE 1

One embodiment of the invention, which is applied to a gate turn-off thyristor (GTO), will be described in detail with reference to FIGS. 1 to 11.

Figure 1:
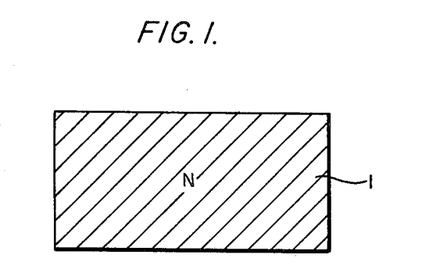
FIGS. 1 to 11 are cross-sectional views of a semiconductor substrate illustrating various steps of one embodiment of the invention.

In FIG. 1, an N-type silicon substrate 1 containing phosphorus of a 40 mm diameter, of a 500 μm thickness and of a 110 Ω.cm resistivity is cleaned in a conventional manner. Next, in FIG. 2, gallium is diffused from both surfaces of substrate 1 into the substrate at a temperature of 1250° C. for approximately 30 hours, using gallium as a diffusion source. P-type layers 2 and 3 of the surface impurity concentration of $2 \times 10^{18}$ cm$^{-3}$ and of the diffusion depth of 50 μm are formed. In this step, boron can be also used as a diffusion source instead of gallium. The P-type layer 2 constitutes a P-type base layer. The P-type layer 3 constitutes a P-type anode layer. The N-type layer 4 placed between these P-type layers 2 and 3 constitutes an N-type base layer.

Figure 3:
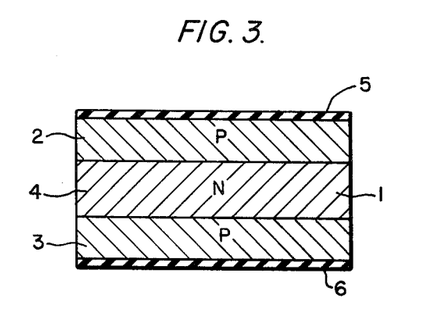

Thereafter, in FIG. 3, thermal oxidation films 5 and 6 of silicon dioxide are grown on the respective surfaces of the substrate 1 in a mixture gas of steam and oxygen at a temperature of 1000° C. for approximately 2 hours. The thickness of the thermal oxidation films 5 and 6 is approximately 5000 Å each.

Figure 4:
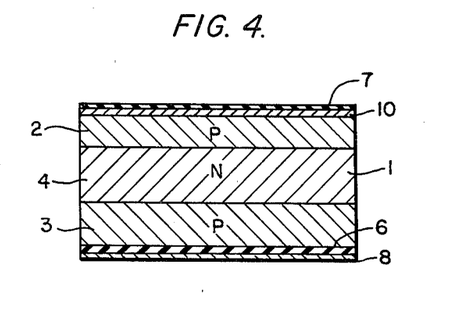

Film 5 is then removed, and phosphorsilicate glass films 7 and 8 are deposited respectively on both sides of the substrate 1. This phosphorsilicate glass deposition is performed at a temperature of 1100° C. for approximately 2 hours, using phosphorus oxychloride (POCl$_3$) as a source. Any film containing such an element as antimony or arsenic instead of phosphorsilicate glass films 7 and 8, can be deposited. The formation of these films 7 and 8, which serve as diffusion sources, can be performed by various known methods other than the method described. When the deposition has finished, an N-type layer 10 having high impurity concentration and a 3 μm thickness is formed in the surface region of the P-type base layer 2, and the carrier lifetime of layer 2 is increased (FIG. 4).

Figure 5:
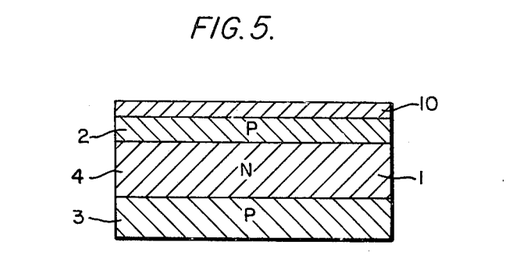

Next, the phosphorsilicate glass films 7 and 8 and thermal oxidation film 6 are removed. Thereafter, N-type impurities, that is to say phosphorus atoms, are driven into the P-type base layer 2 at a temperature of 1200° C. for approximately 8 hours, and an N-type layer 10 comes to be 10 μm in thickness (FIG. 5). At this time, the carrier lifetime of the P-type base layer 2 becomes much lower.

Figure 6:
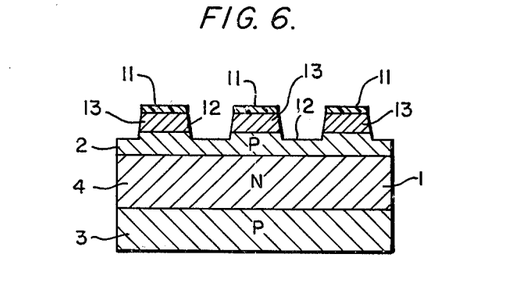

A resistive film is next formed on the N-type layer 10, and it is selectively exposed and is developed to form a resistor pattern 11. Thereafter, using this resistor pattern 11 as a mask, the N-type layer 10 and the surface region of the P-type layer 2 is mesa-etched by a conventional dry or wet etching method, and recesses 12 and N-type cathode layers 13 are formed (FIG. 6).

Figure 7:
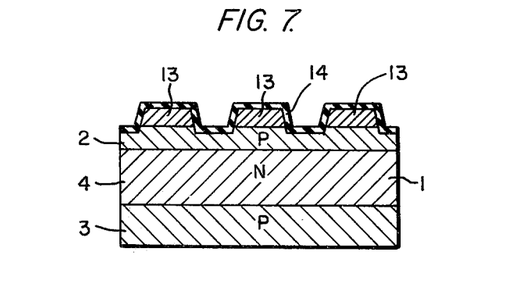

After this, both surfaces of substrate 1 are thermally oxidized in a mixture gas of steam and oxygen at a temperature of 1000° C. for approximately 2 hours, and thermal oxidation films of 5000 Å in thickness are formed. The thermal oxidation film on the anode layer 3 side is removed, and the thermal oxidation film 14 on the cathode layers 13 side is left (FIG. 7).

Figure 8:
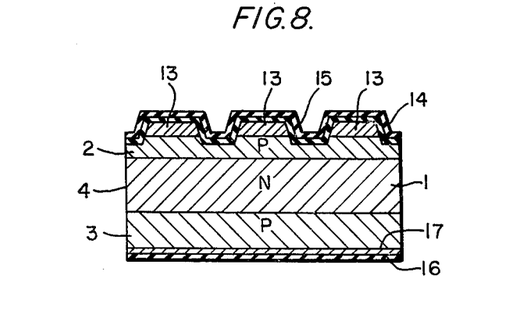

Next, phosphorsilicate glass films 15 and 16 are deposited on the both surfaces of the substrate 1, using phosphorus oxychloride (POCl$_3$) as a source, at a temperature of 1000° C. for approximately 1 hour. These phosphorsilicate glass films 15 and 16 can contain such impurities as gallium. The formation of these films 15 and 16 can be performed by various known methods other than the method described. On formation of the films 15 and 16, an N-type layer 17 having high impurity concentration and about 1 μm thickness is formed in the surface region of the anode layer 3 (FIG. 8). Heavy metallic contaminations such as copper, iron and gold are caught into the phosphorsilicate glass film 16 or collected into the surface region of the substrate 1. As a result, carrier lifetime of the P-type base layer 2 is increased.

Figure 9:
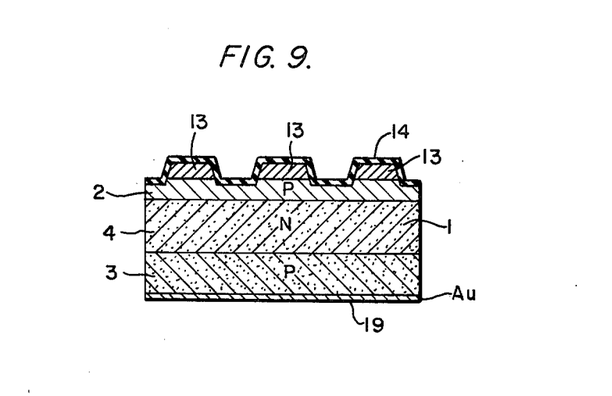

Next, the phosphorsilicate glass films 15 and 16, and N-type layer 17 are removed, and thereafter a gold film 19 is evaporated as a material for stimulating carrier recombination, that is to say, lifetime killer atoms, on the surface of the anode layer 3. At a temperature of 800° C. for approximately 1 hour, gold diffusion is performed, so that the carrier lifetime of the N-type base layer 4 is controlled (FIG. 9). Instead of gold, platinum can be used to control the carrier lifetime. Carrier lifetime killer can be introduced by irradiating the semiconductor substrate 1 by electron radiation, for example, under the condition of 3 MeV electron energy and $10^{14}$ electrons/cm$^2$ dosage.

Figure 10:
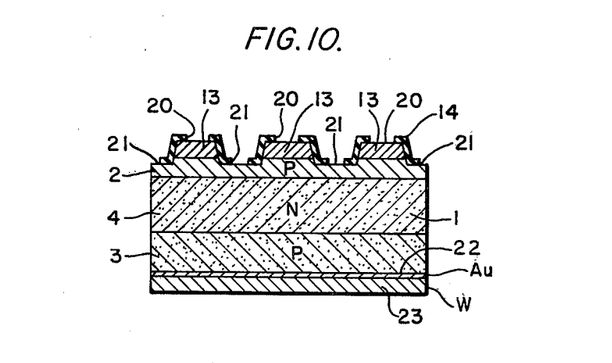

After the gold film 19 is removed, oxidation film 14 is selectively removed by a photoengraving process and contact holes 20 for cathode electrodes and contact holes 21 for gate electrodes are formed. Thereafter, substrate 1 is fixed to a tungsten disk 23 after some pressure with a thin aluminum film 22 between them. Then the entire assembly is heat-treated at a temperature of 700° C. for approximately 2 hours, and the silicon, aluminum and tungsten are alloyed (FIG. 10).

Figure 11:
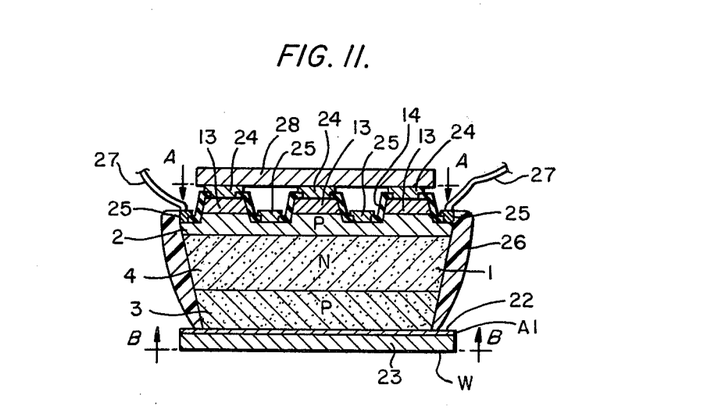

Next, an aluminum film is evaporated on the overall surface of the cathode side of the substrate 1, and is selectively etched-off to form cathode electrodes 24 and gate electrodes 25. The substrate 1 is then heat-treated at a temperature of 500° C. for approximately 15 minutes to obtain respective electrode ohmic-contact. Thereafter, as shown in FIG. 11, the periphery of the substrate 1 is beveled, and it is also encapsulated by a silicone rubber 26 for passivation of the beveled surface. Gate lead wires 27 of aluminum are next connected to gate electrodes 25 by bonding, and a molybdenum cathode disk 28 is contacted with the cathode electrodes 24 under some pressure. Thereby a gate turn-off thyristor is completed.

Figure 12:
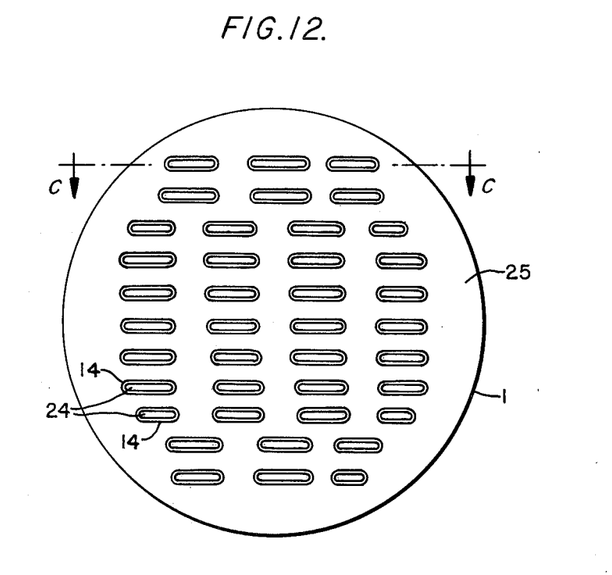
FIGS. 12 and 13 show cross-sectional views taken along line A—A and B—B in FIG. 11, respectively.
Figure 13:
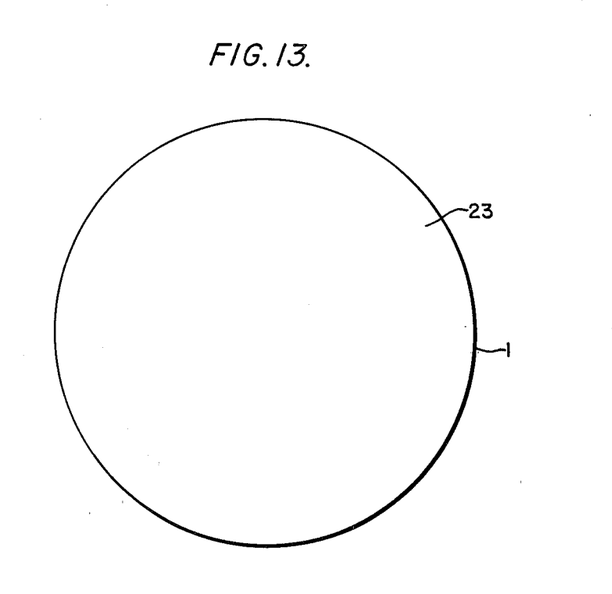

FIG. 12 shows the cross-sectional view of the substrate 1 taken along line A—A of FIG. 11. FIG. 13 shows the cross-sectional view of the substrate 1 taken along line B—B of FIG. 11. The cross-sectional view taken along line C—C of FIG. 12 corresponds to FIG. 11.

Figure 2:
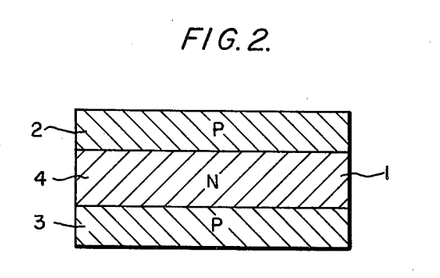
Figure 14:
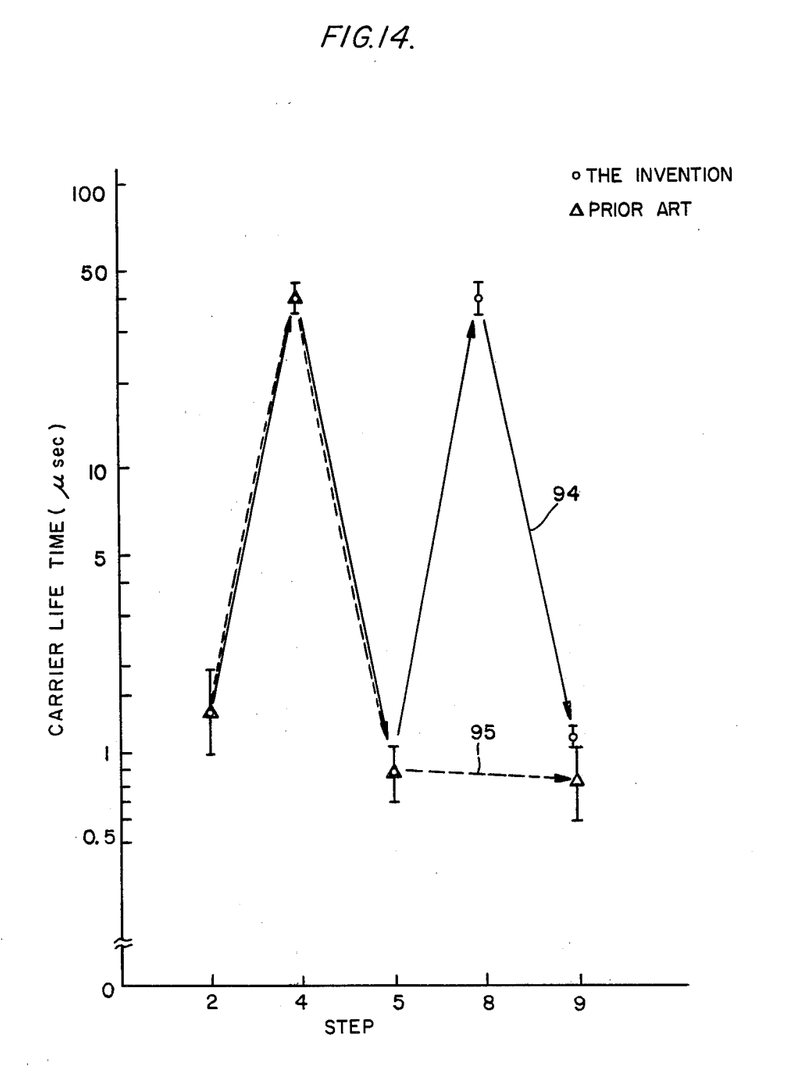
FIG. 14 illustrates a comparison of carrier lifeime variations in an N-type base layer made according to the embodiment of the invention as given from FIGS. 1 to 11 and according to a conventional method.

In FIG. 14, arrows 94 of solid lines show the process sequence of the method mentioned above according to the invention, and the round marks represent the values of minority carrier lifetimes of the N-type base layers 4 at the respective steps. On the other hand, in FIG. 14, arrows 95 of dotted lines show the process sequence of a conventional method, and the triangle marks represent the values of minority carrier lifetimes of the N-type base layers at the respective steps. In FIG. 14, step 2 is the time when the gallium diffusion has finished (FIG. 2). Step 4 is the time when the deposition of phosphorsilicate glass film has finished (FIG. 4). Step 5 is the time when the phosphorus diffusion under a high temperature has finished (FIG. 5). Step 8 is the time when the phosphorsilicate glass film has been deposited in accordance with the subject invention (FIG. 8). Step 9 corresponds to the time when the gold diffusion is finished.

According to this invention, carrier lifetime of the N-type base layer at Step 9 is 1.1~1.3 μsec, which is controlled within a small deviation, compared with 0.6~1.1 μsec values obtained from a conventional method. These carrier lifetimes have been measured by a well-known diode voltage decay method. In this case, minority carrier lifetime of the P-type base layer can be calculated from the minority carrier lifetime of the N-type base layer or can be estimated from electrical characteristics of the thyristor made. An explanation of the former follows.

If X is the depth of the P-type base layer, $t_{PB}(X)$ is the carrier lifetime of the P-type base layer expressed as a function of X, $t_{NB}$ is the carrier lifetime of the N-type base layer, $C_{NB}$ is the impurity concentration of the N-type base layer, and $C_{PB}(X)$ is the impurity concentration of the P-type base layer which is a function of X, then:

$$t_{PB}(X) = t_{NB}\sqrt{\frac{C_{NB}}{C_{PB}(X)}}$$

An average lifetime of the P-type base layer $\overline{t_{PB}}$ is approximately expressed by the following formula, if $\overline{C_{PB}}$ is the average impurity concentration of the P-type base layer:

$$\overline{t_{PB}(x)} \approx t_{NB}\sqrt{\frac{C_{NB}}{\overline{C_{PB}}}}$$

In the above fabrication, $C_{NB}=4\times10^{13}$ cm$^{-3}$, $\overline{C_{PB}}=4\times10^{17}$ cm$^{-3}$. So, the following formula is approximately given:

$$\overline{t_{PB}} \approx t_{NB}/100$$

However, the carrier lifetime $\overline{t_{PB}}$ after the gold diffusion cannot be obtained by using the above formula since the carrier lifetime of the N-type base layer after gold diffusion becomes lower than that before gold diffusion. On the other hand, the carrier lifetime of the P-type base layer is scarcely influenced by the gold diffusion and, therefore, is retained as before the gold diffusion. Accordingly, the minority carrier lifetime of the P-type base layer becomes very high. Actually, the minority carrier lifetime of the P-type base layer according to the invention was approximately 40 times higher than that of a conventional method.

Another method for decreasing the carrier lifetime of the N-type base layer 4 (i.e., introducing carrier lifetime killer) is to generate crystal defects and vacancies in silicon crystal by electron irradiation. The crystal defects profile has not been measured exactly, but is substantially the same carrier lifetime distribution in the n- and p-base regions as that of gold diffusion. Carrier lifetime in the N-type base obtained after electron irradiation under the conditions of 3 MeV electron energy and $10^{14}$ electron/cm$^2$ electron dosage corresponds to that of gold diffusion under the condition of 800° C. temperature and a one-hour diffusion time. The electron irradiation process is completed by annealing at a temperature below 350° C., 30 minutes after irradiation.

Figure 15:
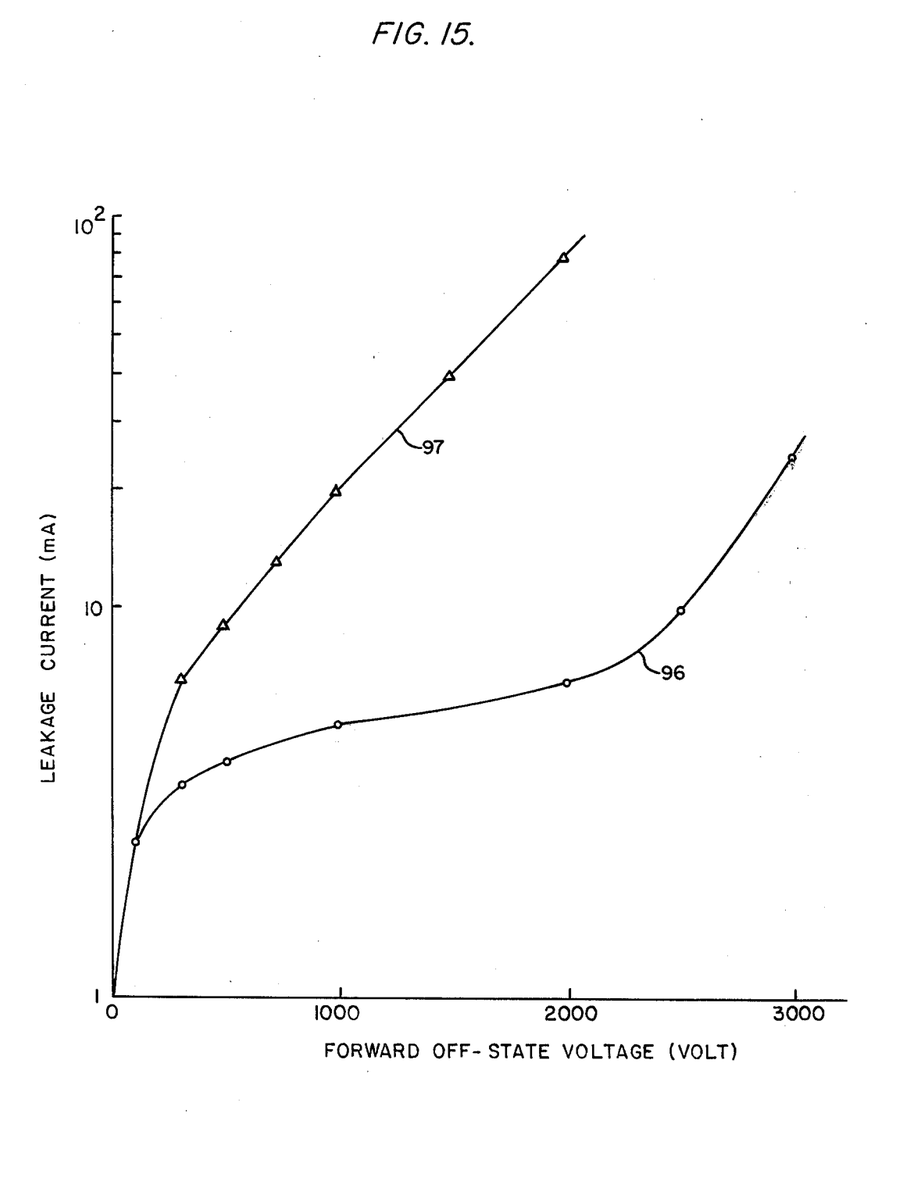
FIG. 15 illustrates a comparison of forward off-state current-voltage characteristics of a thyristor made according to the invention shown in FIGS. 1 to 11 and according to a conventional method.

FIG. 15 shows the forward off-state current-voltage characteristics for the gate turn-off thyristor manufactured by the above-mentioned embodiment of the invention (CURVE 96), and that manufactured by a conventional method (CURVE 97). The characteristics were measured under the condition that each junction temperature was 115° C., and each shunt resistance RGC between cathode and gate was 20Ω. As is obvious from FIG. 15, a forward off-state voltage according to the embodiment of the invention is approximately twice as high as that according to the conventional method.

Figure 16:
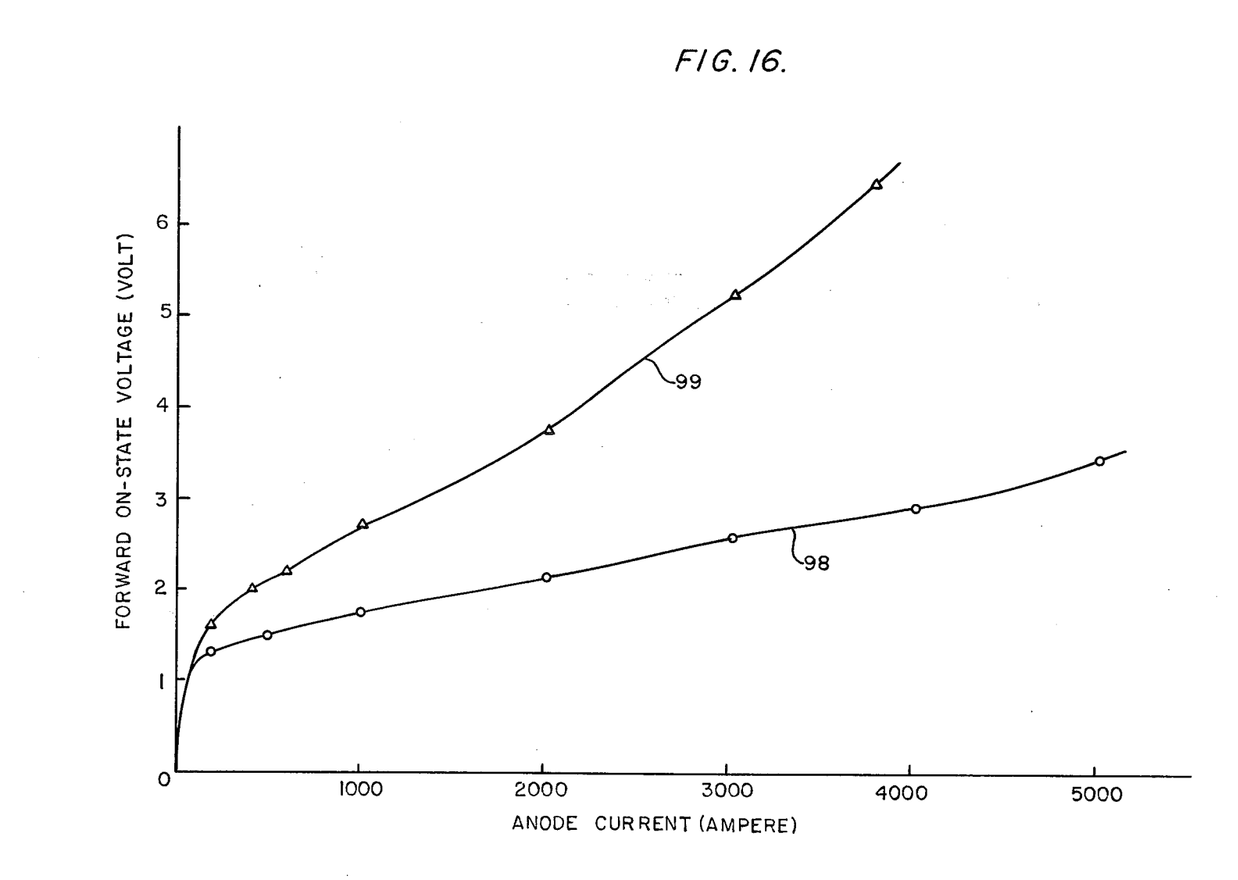
FIG. 16 illustrates a comparison of forward on-state current-voltage characteristics of a thyristor made according to the invention shown in FIGS. 1 to 11 and according to a conventional method.

FIG. 16 shows forward on-state current-voltage characteristics for the gate turn-off thyristor manufactured by the above-mentioned embodiment of the invention (CURVE 98) and that manufactured by a conventional method (CURVE 99). In this case, the characteristics were measured under the condition that each total cathode area was 3.02 cm$^2$, and each current-voltage value was obtained for a 50 Hz sinusoidal one-cycle peak waveform.

As is obvious from FIG. 16, the forward on-state voltage at the anode current of 1000 A according to the embodiment of the invention is only half as much as that according to the conventional method. As a result, the invention makes it possible to decrease the on-state power loss. In addition to these merits, the embodiment of the invention, compared with the conventional method, improves surge current capability from 300 A to 5000 A, and the latching current from 10 A to 2 A.

EXAMPLE 2

Figure 17:
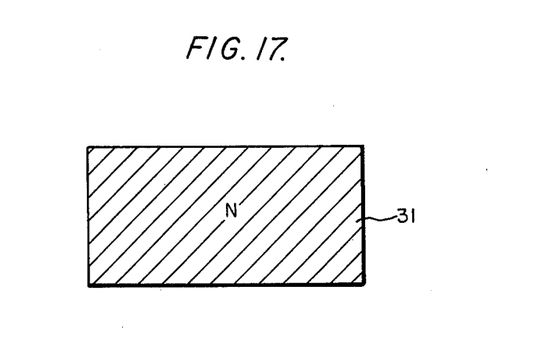
FIGS. 17 and 27 are cross-sectional views of a semiconductor substrate illustrating various steps of another embodiment of the invention.

Another embodiment of the invention, which is applied to a thyristor, will be described in detail with reference to FIGS. 17 to 27. In FIG. 17, an N-type silicon substrate 31 containing phosphorus, of a 40 mm diameter, and 500 μm thickness, and of a 110 Ωcm resistivity is provided with conventional cleaning in preparation for further processing.

Figure 18:
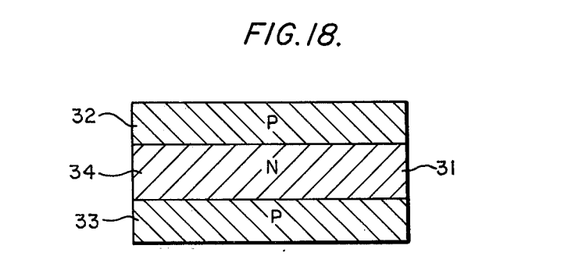

Next, gallium is diffused from both surfaces of the substrate 31 at a temperature of 1250° C. for approximately 30 hours, using gallium as a diffusion source, to form P-type layers 32, 33, with a surface impurity concentration of $2\times10^{18}$ cm$^{-3}$ and a diffusion depth of 50 μm (FIG. 18). In this step, boron can be also used as a diffusion source instead of gallium. The P-type layer 32 constitutes a P-type base layer. The P-type layer 33 constitutes a P-type anode layer, and the N-type layer 34 placed between these P-type layers 32 and 33 constitutes an N-type base layer.

Figure 19:
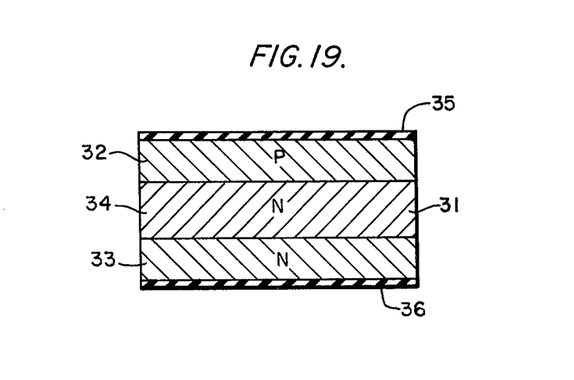

Thermal oxidation films 35 and 36 of silicon dioxide are then grown on the respective surfaces of the substrate 31 in a mixture gas of steam and oxygen, at a temperature of 1000° C., for approximately 2 hours (FIG. 19). The thickness of the thermal oxidation films 35 and 36 is around 5000 Å each. Film 35 is then selectively removed by a known photo engraving process.

After this, phosphorsilicate glass films 37 and 38 are deposited, respectively, one on each side of substrate 31.

Figure 20:
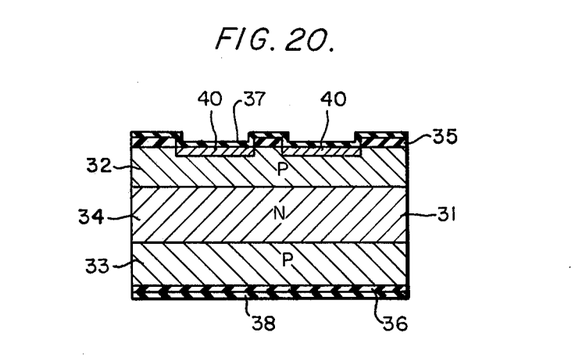

This phosphorsilicate glass deposition is performed at a temperature of 1100° C. for approximately 2 hours, using phosphorus oxychloride (POCl$_3$) as a source. When the deposition is finished, an N-type layer 40 having high impurity concentration and a 3 μm thickness is formed in the surface region of the P-type base layer 32, and the carrier lifetime of the layer 32 is increased (FIG. 20).

Figure 21:
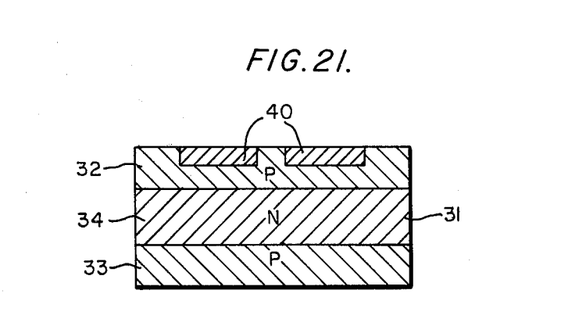
Figure 22:
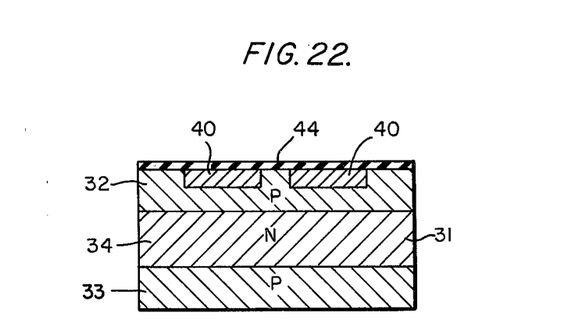

Next, phosphorsilicate glass films 37 and 38 and thermal oxidation films 35 and 36 are removed. Thereafter, N-type impurities, that is to say phosphorus atoms, are driven into the P-type base layer 32 at the temperature of 1200° C. for approximately 8 hours, and N-type layer 40 comes to be 10 μm in thickness (FIG. 21). At this time, the carrier lifetime of the P-type base layer 32 becomes much lower. Afterwards, both surfaces of the substrate 31 are thermally oxidized in a mixture gas of steam and oxygen at a temperature of 1000° C. for approximately 2 hours, and thermal oxidation films of 5000 Å in thickness are formed. The thermal oxidation film on the anode side is removed, and the thermal oxidation film 44 on the cathode side is left (FIG. 22).

Figure 23:
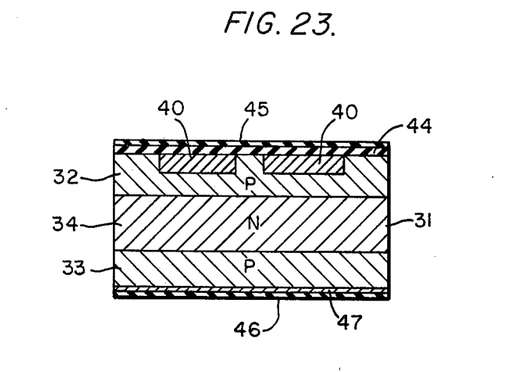

Phosphorsilicate glass films 45 and 46 are then deposited on both surfaces of the substrate 31, using phosphorus oxychloride (POCl$_3$) as a source, at a temperature of 1000° C., for approximately 1 hour. At the same time, an N-type layer 47 of high impurity concentration and of approximately 1 μm thickness is formed in the surface region of the anode layer 33 (FIG. 23). After this process, the carrier lifetime of the P-type base layer 32 is increased.

Figure 24:
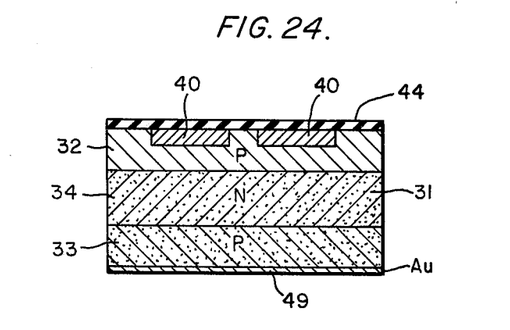

Next, the phosphorsilicate glass films 45 and 46 and the N-type layer 47 are removed. Thereafter, a gold film 49 is evaporated on the surface of the anode layer 33 as a material for stimulating carrier recombination, that is to say lifetime killer atoms. Gold diffusion is performed at a temperature of 800° C. for approximately 1 hour so that carrier lifetime of the N-type base layer 34 is controlled (FIG. 24).

Figure 25:
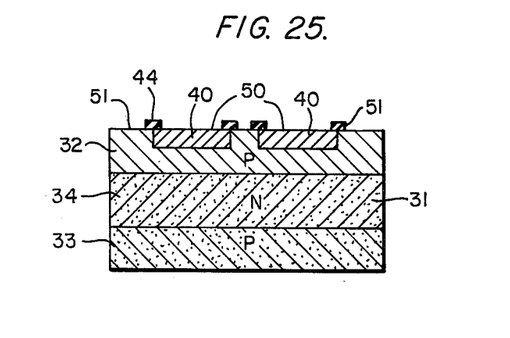
Figure 26:
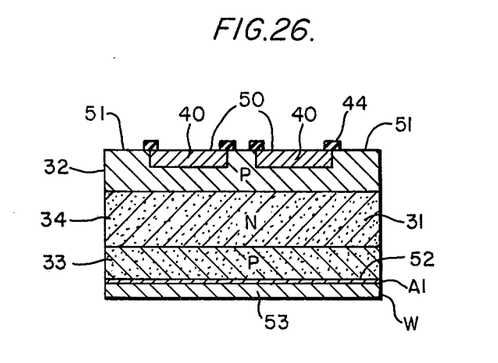

After the gold film 49 is removed, oxidation film 44 is selectively removed by a photoengraving process and contact holes 50 for cathode electrodes and contact holes 51 for gate electrodes are formed (FIG. 25). After this, the substrate 31 is fixed to a tungsten disk 53 under some pressure with a thin aluminum film 52 between them. The assembly is then heat-treated at a temperature of 700° C. for approximately 2 hours, and the silicon, aluminum and tungsten are alloyed (FIG. 26).

Figure 27:
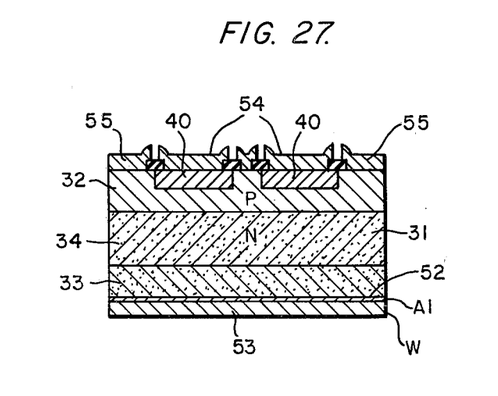

Next, an aluminum film is evaporated on the overall surface of the cathode side of the substrate 31. The film is selectively etched off to form cathode electrodes 54 and gate electrodes 55. Substrate 31 is then heat-treated at a temperature of 500° C. for approximately 15 minutes, and the thyristor is completed (FIG. 27).

In this thyristor, as compared with a thyristor made by a conventional method, minority carrier lifetime of the P-type base layer is also improved, and high-current characteristics are achieved.

By the way, the temperature to form the phosphorsilicate glass films 15 and 75 mentioned above is desired to be from 700° C. to 1100° C. The reason for this follows from a study of the temperature dependency upon the diffusion coefficient of copper, iron and gold, which are metallic contaminations in semiconductor substrates.

The diffusion coefficient of copper or iron is $6 \times 10^{-9}$ cm$^2$/sec at the temperature of 500° C., but is much increased to become more than $10^{-6}$ cm$^2$/sec at the temperature of more than 900° C. The diffusion coefficient of gold is $10^{-9}$ cm$^2$/sec at the temperature of 500° C., but is much increased to become more than $10^{-7}$ cm$^2$/sec at a temperature of more than 900° C.

Accordingly, at the temperature of more than 900° C., diffusion of the heavy metallic contaminations is stimulated and the heavy metallic atoms in a semiconductor substrate is absorbed into a phosphorsilicate glass film sufficiently. If the temperature to form the film is above 1100° C., phosphorus in the phosphorsilicate glass film will be diffused into the semiconductor substrate, so that the impurity concentration distribution in the substrate will be unfavorably changed.

Accordingly, the temperature to form phosphorsilicate glass films is desired to range from 700° C. to 1100° C. Within such a temperature, crystal defects in a semiconductor substrate is decreased by the anneal effect. For example, the number of crystal defects in the substrate is decreased to become approximately 1/100 of that at the time before the substrate is heated.

Further, in the above-mentioned methods, the thermal oxidation films 14, and 44 for preventing phosphorus diffusion are formed under the phosphorsilicate glass films 15, 45, and 75, respectively. However, without formation of the thermal oxidation films, the steps of forming a phosphorsilicate glass film, removing it, and thereafter etching-off a surface region of the substrate where phosphorus is diffused can be adopted In addition, the P-type layers 2, 3, 32, and 33 can be formed on the formation of the N-type layers 10 and 40, using what is called simultaneous diffusion technique.

What is claimed is:

1. A method for manufacturing power thyristors, comprising the steps of:
    preparing an N-type semiconductor substrate;
    forming respective P-type layers on both sides of the semiconductor substrate, one of the layers constituting a P-type base layer, the other layer constituting an anode layer and the N-type substrate located therebetween constituting an N-type base layer;
    forming a first film containing N-type impurities on the P-type base layer and doping the N-type impurities into the surface region of the semiconductor substrate;
    removing the first film;
    heating the semiconductor substrate in order to drive the N-type impurities more deeply into the P-type base layer and making an N-type cathode layer;
    forming an oxide layer on the N-type cathode layer;
    forming respective second films containing phosphorus as gettering material on both the oxide layer and the P-type anode layer in order to increase the carrier lifetime of the P-type base layer;
    removing the second films; and
    diffusing carrier lifetime killer atoms into the N-type base layer in order to decrease the carrier lifetime thereof.

2. The method for manufacturing power thyristors according to claim 1, wherein the carrier lifetime killer atoms are gold atoms.

3. The method for manufacturing power thyristors according to claim 1, wherein the N-type impurities are phosphorus, arsenic or antimony.

4. The method for manufacturing power thyristors according to claim 1, wherein the second films are phosphorsilicate glass films.

5. The method for manufacturing power thyristors according to claim 1, wherein the formation of the first film is carried out at a temperature ranging from 700° C. to 1100° C.

6. A method for manufacturing power thyristors, comprising the steps of:
   preparing an N-type semiconductor substrate; forming respective P-type layers on both sides of the semiconductor substrate, one of the layers constituting a P-type base layer, the other layer constituting an anode layer and the N-type substrate located therebetween constituting an N-type base layer;
   forming a first film containing N-type impurities on the P-type base layer and doping the N-type impurities into the surface region of the semiconductor substrate;
   removing the first film;
   heating the semiconductor substrate in order to drive the N-type impurities more deeply into the P-type base layer and making an N-type cathode layer;
   forming respective second films containing phosphorus as gettering material on both the oxide layer and the P-type anode layer in order to increase the carrier lifetime of the P-type base layer;
   removing the second films; and
   introducing carrier lifetime killer into the N-type base layer in order to decrease the carrier lifetime thereof.

7. The method for manufacturing power thyristors according to claim 6, wherein the carrier lifetime killer is introduced by irradiating the semiconductor substrate by electron radiation.

* * * * *